(12) United States Patent
Tsukizawa et al.

(10) Patent No.: US 8,503,147 B2
(45) Date of Patent: Aug. 6, 2013

(54) ESD PROTECTION DEVICE

(75) Inventors: Takayuki Tsukizawa, Nagaokakyo (JP); Tetsuya Ikeda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 178 days.

(21) Appl. No.: 13/106,960

(22) Filed: May 13, 2011

(65) Prior Publication Data

US 2011/0279945 A1    Nov. 17, 2011

(30) Foreign Application Priority Data

May 17, 2010 (JP) ................................. 2010-113671

(51) Int. Cl.
*H02H 1/04* (2006.01)
*H02H 3/22* (2006.01)

(52) U.S. Cl.
USPC .............. 361/112; 361/127; 361/126; 361/56

(58) Field of Classification Search
USPC .................... 361/112, 127, 126, 56
See application file for complete search history.

(56) References Cited

U.S. PATENT DOCUMENTS

| | | | |
|---|---|---|---|
| 7,279,724 B2 * | 10/2007 | Collins et al. ................. | 257/103 |
| 7,868,732 B2 * | 1/2011 | Hoidis et al. ................... | 338/20 |
| 2010/0309595 A1 | 12/2010 | Adachi et al. | |
| 2011/0216456 A1 * | 9/2011 | Yamamoto et al. ............. | 361/56 |

FOREIGN PATENT DOCUMENTS

| | | |
|---|---|---|
| JP | 10-069960 A | 3/1998 |
| JP | 2000-068029 A | 3/2000 |
| JP | 2001-043954 A | 2/2001 |
| WO | 2009/098944 A1 | 8/2009 |

OTHER PUBLICATIONS

Official Communication issued in corresponding Japanese Patent Application No. 2010-113671, mailed on Aug. 16, 2012.

\* cited by examiner

*Primary Examiner* — Rexford Barnie
*Assistant Examiner* — Zeev V Kitov
(74) *Attorney, Agent, or Firm* — Keating & Bennett, LLP

(57) ABSTRACT

An ESD protection device includes a ceramic multilayer substrate including a plurality of laminated insulating layers, an external electrode, at least one of an in-plane connecting conductor and an interlayer connecting conductor, and a mixture portion. The mixture portion is provided along a principal surface of one of the insulating layers and includes a dispersed material including at least one of metal and semiconductor; metal and ceramic; metal, semiconductor, and ceramic; semiconductor and ceramic; semiconductor; metal coated with an inorganic material; metal coated with an inorganic material and semiconductor; metal coated with an inorganic material and ceramic; and metal coated with an inorganic material, semiconductor, and ceramic. The mixture portion is connected to the external electrode and at least one of the in-plane connecting conductor and the interlayer connecting conductor.

5 Claims, 10 Drawing Sheets

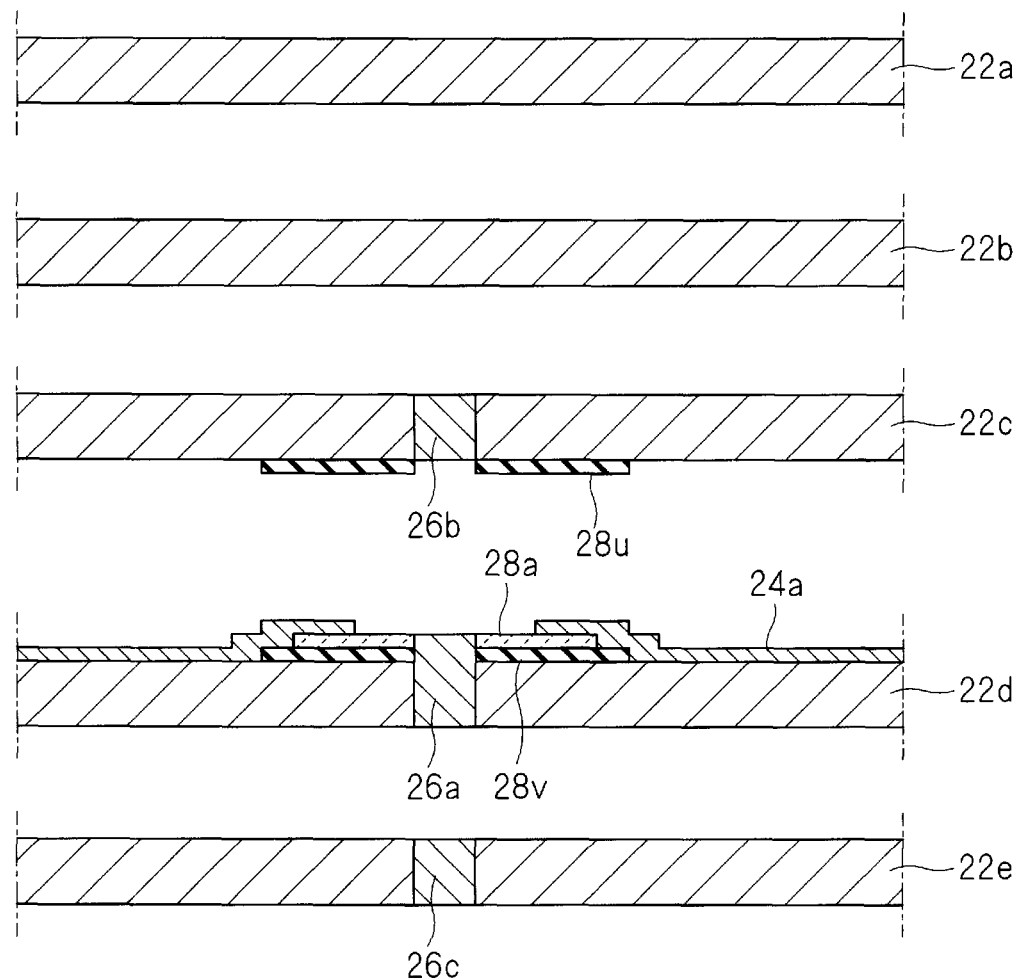

ESD PROTECTION DEVICE

BACKGROUND OF THE INVENTION

1. Field of the Invention

The present invention relates to an electrostatic discharge (ESD) protection device, and specifically to ESD protection devices, either having an ESD protection function only or having an ESD protection function and other functions.

2. Description of the Related Art

ESD is a phenomenon in which strong discharge is generated when a charged conductive body (e.g., human body) comes into contact with or comes sufficiently close to another conductive body (e.g., electronic device). ESD causes damage or malfunctioning of electronic devices. To prevent this, an excessively high voltage generated during discharge must be prevented from being applied to circuits of the electronic devices. ESD protection devices used for such an application are also called surge absorbers.

An ESD protection device is disposed, for example, between a signal line and a ground of a circuit. The ESD protection device includes a pair of discharge electrodes that face each other with a space provided therebetween. Therefore, the ESD protection device has high resistance under normal operation and a signal is not sent to the ground. When an excessively high voltage, for example, generated by static electricity through an antenna of a cellular phone is applied, discharge is generated between the discharge electrodes of the ESD protection device, which leads the static electricity to the ground. Thus, a voltage generated by static electricity is not applied to the circuits disposed downstream from the ESD protection device, which protects the circuits.

For example, an ESD protection device shown in an exploded perspective view of FIG. 9 and a sectional view of FIG. 10 includes a cavity 5 provided in a ceramic multilayer substrate made by laminating insulating ceramic sheets 2. Discharge electrodes 6 that face each other and that are electrically connected to external electrodes 1 are disposed in the cavity 5 that includes discharge gas. When a breakdown voltage is applied between the discharge electrodes 6, discharge is generated between the discharge electrodes 6 in the cavity 5, which leads an excessive voltage to the ground. Consequently, the circuits disposed downstream from the ESD protection device are protected (see, for example, Japanese Unexamined Patent Application Publication No. 2001-43954).

In this ESD protection device, the discharge electrodes disposed on both sides of the discharge space are connected to the external electrodes. Since a certain amount of space or greater is required with such a structure, it is difficult to reduce the size of the ESD protection device. Furthermore, when high voltage static electricity is continuously applied in a repetitive manner, the discharge electrodes are melted and a short circuit occurs between the discharge electrodes. Alternatively, the distance between the discharge electrodes is increased and, thus, a discharge starting voltage is increased.

SUMMARY OF THE INVENTION

To overcome the problems described above, preferred embodiments of the present invention provide an ESD protection device that is significantly reduced in size and has an extremely reliable ESD protection function.

According to a preferred embodiment of the present invention, an ESD protection device preferably includes a ceramic multilayer substrate including a plurality of laminated insulating layers made of a ceramic material, at least one external electrode provided on a side surface of the ceramic multilayer substrate so as to be exposed outside the ceramic multilayer substrate, at least one of an in-plane connecting conductor arranged along a first principal surface of one of the insulating layers and an interlayer connecting conductor arranged so as to be disposed between the first principal surface and a second principal surface of the insulating layer, the in-plane connecting conductor and the interlayer connecting conductor having conductivity, and a mixture portion arranged along the first principal surface of the insulating layer and including a dispersed material including at least one of metal and semiconductor; metal and ceramic; metal, semiconductor, and ceramic; semiconductor and ceramic; semiconductor; metal coated with an inorganic material; metal coated with an inorganic material and semiconductor; metal coated with an inorganic material and ceramic; and metal coated with an inorganic material, semiconductor, and ceramic. The mixture portion is preferably connected to the at least one external electrode and the at least one of the in-plane connecting conductor and the interlayer connecting conductor.

In the above-described structure, the mixture portion is preferably disposed between the external electrode and at least one of the in-plane connecting conductor and the interlayer connecting conductor. When a certain voltage or greater is applied between the external electrode and at least one of the in-plane connecting conductor and the interlayer connecting conductor, discharge can be generated at the mixture portion.

In the above-described structure, the space required to provide an ESD protection element is decreased by connecting the external electrode to the mixture portion and using the external electrode as one of discharge electrodes, as compared to the case in which both discharge electrodes of the mixture portion are in-plane connecting conductors or interlayer connecting conductors. As a result, the ESD protection device can easily be reduced in size.

Furthermore, by using the external electrode as one of the discharge electrodes disposed with the mixture portion therebetween, heat generated when static electricity is applied is efficiently dissipated to the outside of the ceramic multilayer substrate through the external electrode. Thus, as compared to the case in which both discharge electrodes of the mixture portion are in-plane connecting conductors or interlayer connecting conductors, an increase in temperature caused by repetitive discharges is prevented and, thus, the discharge electrodes are prevented from being melted.

The mixture portion preferably includes a metal material and a semiconductor material dispersed therein, for example.

In this case, since the metal material and the semiconductor material are dispersed in the mixture portion at which discharge is generated, electrons are easily moved in the mixture portion. Thus, discharge is more efficiently generated, and the responsivity to ESD is improved.

Furthermore, a fluctuation in responsivity to ESD caused by variation in the distance between the discharge electrodes, that is, between the external electrode connected to the mixture portion and the in-plane connecting conductor or interlayer connecting conductor connected to the mixture portion is effectively reduced. As a result, the ESD characteristics are easily adjusted and stable ESD characteristics are obtained.

The semiconductor material dispersed in the mixture portion is preferably silicon carbide or zinc oxide, for example.

Metal particles coated with an insulating inorganic material are preferably dispersed in the mixture portion.

In this case, since the metal particles in the mixture portion are not directly in contact with each other due to being coated with the inorganic material, the probability that a short circuit is caused by the metal particles being brought into contact with each other is significantly reduced.

The ESD protection device preferably further includes a sealing layer that extends between the insulating layer and the mixture portion.

In this case, a glass component included in the ceramic multilayer substrate is prevented from diffusing into the mixture portion.

According to various preferred embodiments of the present invention, a reduction in size is easily achieved and the reliability of an ESD protection function is easily improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a sectional view showing a production process of the ESD protection device shown in FIG. 5.

DETAILED DESCRIPTION OF THE PREFERRED EMBODIMENTS

Preferred embodiments of the present invention will now be described with reference to FIGS. 1 to 8B.

Example 1

An ESD protection device 10 of an Example 1 of a preferred embodiment of the present invention will be described with reference to FIGS. 1 and 4.

Figure 1:
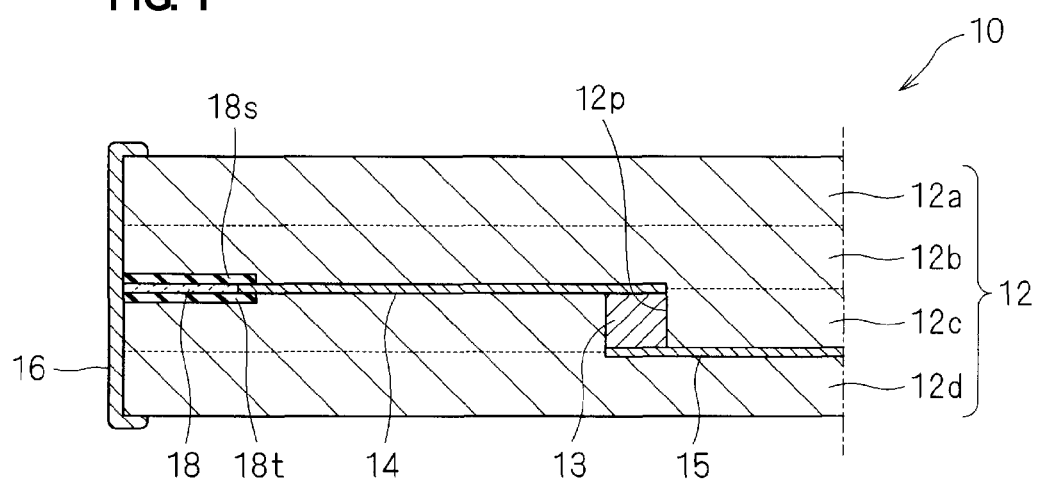
FIG. 1 is a sectional view of a principal portion of an ESD protection device according to a preferred embodiment of the present invention.

FIG. 1 is a sectional view of a principal portion of an ESD protection device 10. The ESD protection device 10 is a single component, i.e., an ESD protection unit, having only an ESD protection function or a composite component having the ESD protection function and other functions. As shown in FIG. 1, the ESD protection device 10 preferably includes a ceramic multilayer substrate 12 made by laminating first to fourth insulating layers 12a to 12d made of a ceramic material and an external electrode provided on the side surface of the ceramic multilayer substrate 12, the external electrode 16 being exposed outside the ceramic multilayer substrate 12. The ceramic multilayer substrate 12 preferably includes a mixture portion 18, first and second in-plane connecting conductors 14 and 15, an interlayer connecting conductor 13, and sealing layers 18s and 18t provided therein.

The first in-plane connecting conductor 14 has conductivity and is arranged between the second and third insulating layers 12b and 12c along the principal surfaces of the second and third insulating layers 12b and 12c. The second in-plane connecting conductor 15 has conductivity and is arranged along the principal surfaces of the third and fourth insulating layers 12c and 12d. The interlayer connecting conductor 13 is a conductive member disposed in a via hole 12p that penetrates between the principal surfaces of the third insulating layer 12c. The interlayer connecting conductor 13 is connected to the first and second in-plane connecting conductors 14 and 15.

The mixture portion 18 is arranged between the second and third insulating layers 12b and 12c, at a location at which the first in-plane connecting conductor 14 is provided, along the principal surfaces of the second and third insulating layers 12b and 12c.

The mixture portion 18 is connected to the external electrode 16 and the first in-plane connecting conductor 14. The mixture portion 18 is arranged so that discharge is generated at the mixture portion 18 when a certain voltage or greater is applied between the external electrode 16 and the first in-plane connecting conductor 14. In other words, the external electrode 16 and the first in-plane connecting conductor 14 arranged with the mixture portion 18 disposed therebetween so as to face each other in the principal-surface direction of the insulating layers 12b and 12c define discharge electrodes.

The mixture portion 18 is preferably obtained by dispersing a material including at least one of metal and semiconductor; metal and ceramic; metal, semiconductor, and ceramic; semiconductor and ceramic; semiconductor; metal coated with an inorganic material; metal coated with an inorganic material and semiconductor; metal coated with an inorganic material and ceramic; and metal coated with an inorganic material, semiconductor, and ceramic. The mixture portion 18 preferably has an overall insulating property.

Figure 4:
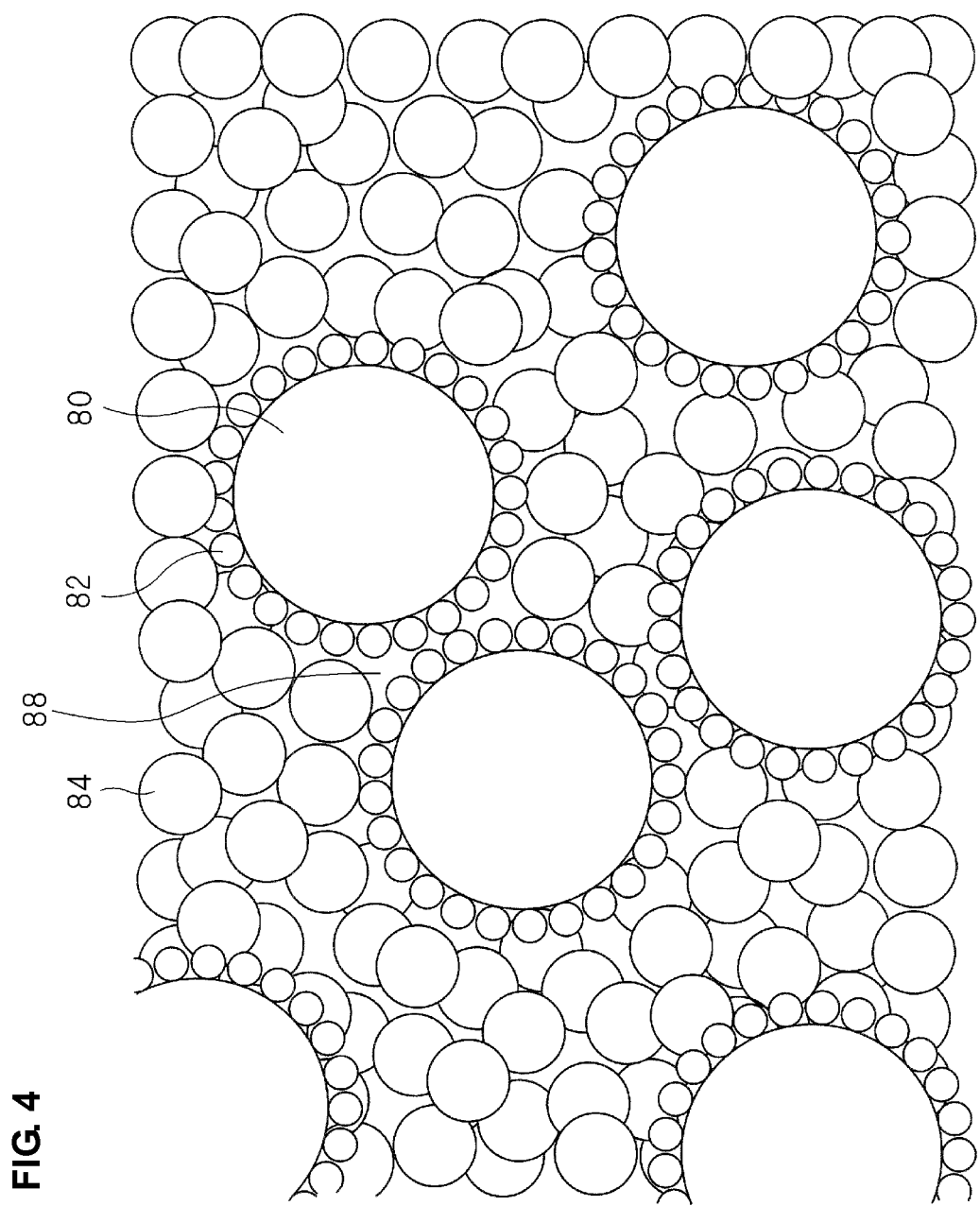
FIG. 4 is a schematic view showing a structure of a mixture portion according to a preferred embodiment of the present invention.

For example, as schematically shown in FIG. 4, the mixture portion 18 preferably includes a metal material 80 coated with an insulating inorganic material 82, a semiconductor material 84, and a gap 88 dispersed therein. For example, preferably, the metal material 80 is made of Cu particles having a diameter of about 2 μm to about 3 μm and the inorganic material 82 is made of $Al_2O_3$ particles having a diameter of about 1 μm or less. The semiconductor material 84 is preferably made of silicon carbide, zinc oxide, or other suitable material, for example.

The inorganic material and the semiconductor material react with each other during firing and may be modified after the firing. The semiconductor material and ceramic powder included in the ceramic multilayer substrate also react with each other during firing and may be modified after the firing.

In the case in which the metal material is not coated with an inorganic material, metal particles of the metal material may be in contact with each other even before the firing, which sometimes causes a short circuit due to the connection of the metal particles. In contrast, when the metal material is coated with an inorganic material, metal particles of the metal material are not brought into contact with each other before the firing. Even if the inorganic material is modified after the firing, the state in which the metal particles are separated from each other is maintained. Therefore, the coating of the metal material with an inorganic material reduces the probability that a short circuit will occur as a result of metal particles being brought into contact with each other.

When the mixture portion 18 at which discharge is generated includes a metal material and a semiconductor material dispersed therein, electrons are easily moved and discharge is more efficiently generated, whereby the responsivity to ESD is improved. Furthermore, a fluctuation in responsivity to ESD caused by variations in the distance between the external electrode 16 connected to the mixture portion 18 and the first in-plane connecting conductor 14 connected to the mixture portion 18, that is, by variation in the distance between the discharge electrodes, is significantly reduced. As a result, the ESD characteristics are easily adjusted and stable ESD characteristics are achieved.

The discharge starting voltage can preferably be set to be a desired value by adjusting the length (i.e., discharge width) of portions at which the external electrode 16 and the first in-plane connecting conductor 14 face each other with the mixture portion 18 disposed therebetween, the distance, i.e., discharge gap, between the external electrode 16 and the first in-plane connecting conductor 14 that face each other with the mixture portion 18 disposed therebetween, the thickness of the mixture portion 18, and the amount, type, and particle size of the materials included in the mixture portion 18.

Preferably, the sealing layer 18s extends between the mixture portion 18 and the second insulating layer 12b and the sealing layer 18t extends between the mixture portion 18 and the third insulating layer 12c. With the sealing layers 18s and 18t, a glass component included in the ceramic multilayer substrate 12 is prevented from diffusing into the mixture portion 18. However, the sealing layers 18s and 18t are not necessarily provided.

As in an ESD protection device 11 of an Example 2 of a preferred embodiment described below, the ESD protection device 10 can be produced by performing lamination and press bonding of ceramic green sheets.

In the ESD protection device 10, one of the discharge electrodes that face each other with the mixture portion 18 disposed therebetween is the external electrode 16 and the other is the first in-plane connecting conductor 14. Therefore, the space required to provide an ESD protection element is decreased as compared to the case in which both discharge electrodes that face each other with a mixture portion disposed therebetween are in-plane connecting conductors or interlayer connecting conductors. As a result, the size of ESD protection device 10 can be easily reduced.

In addition, a portion of heat generated when static electricity is applied is efficiently dissipated to the outside of the ceramic multilayer substrate 12 through the external electrode 16. Thus, as compared to the case in which both discharge electrodes of a mixture portion are in-plane connecting conductors or interlayer connecting conductors, an increase in temperature caused by repetitive discharges is prevented and, thus, the discharge electrodes are effectively prevented from being melted.

Although not shown in FIG. 1, without providing the interlayer connecting conductor 13 and the second in-plane connecting conductor 15, the in-plane connecting conductor 14 connected to the mixture portion 18 may be connected to an external electrode other than the external electrode 16. The mixture portion 18 may be connected to an interlayer connecting conductor without providing the first in-plane connecting conductor 14.

Example 2

An ESD protection device 11 of an Example 2 of a preferred embodiment of the present invention will be described with reference to FIGS. 2 to 4.

Figure 2:
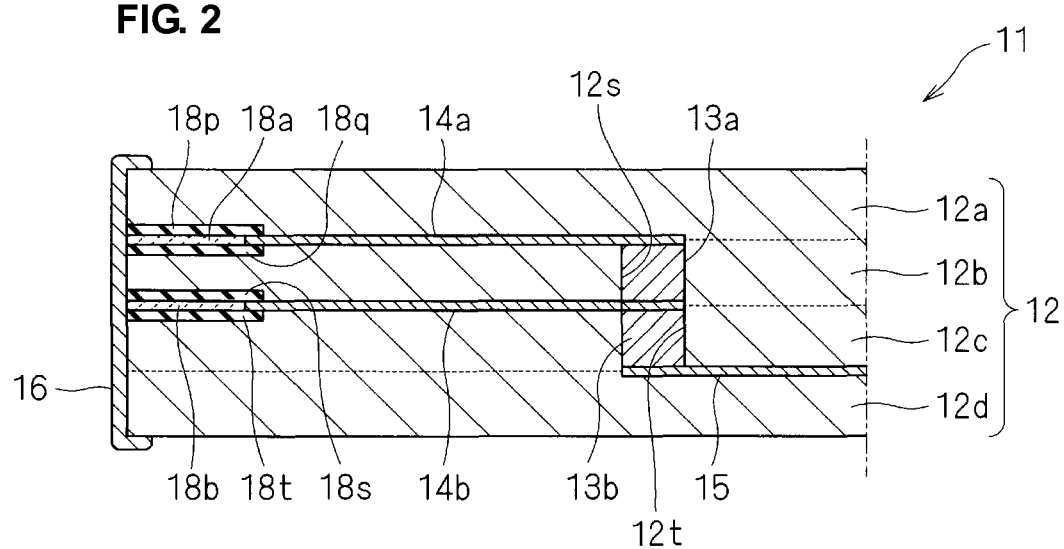
FIG. 2 is a sectional view of a principal portion of an ESD protection device according to another preferred embodiment of the present invention.

FIG. 2 is a sectional view of a principal portion of an ESD protection device 11. The ESD protection device 11 is a single component, e.g., an ESD protection unit, having only an ESD protection function or a composite component having the ESD protection function and other functions. As shown in FIG. 2, the ESD protection device 11 has substantially the same structure as that of the ESD protection device 10 of Example 1. Hereinafter, the same elements and components as those in Example 1 are designated by the same reference numerals.

The ESD protection device 11 preferably includes a ceramic multilayer substrate 12 formed by laminating first to fourth insulating layers 12a to 12d made of a ceramic material and an external electrode 16 provided on the side surface of the ceramic multilayer substrate 12. The ceramic multilayer substrate 12 preferably includes first and second mixture portions 18a and 18b, first to third in-plane connecting conductors 14a, 14b, and 15, first and second interlayer connecting conductors 13a and 13b, and sealing layers 18p, 18q, 18s, and 18t provided therein.

The first and second interlayer connecting conductors 13a and 13b are respectively provided in a via hole 12s that penetrates between the principal surfaces of the second insulating layer 12b and a via hole 12t that penetrates between the principal surfaces of the third insulating layer 12c.

The first mixture portion 18a and the first in-plane connecting conductor 14a are disposed between the first and second insulating layers 12a and 12b. The second mixture portion 18b and the second in-plane connecting conductor 14b are disposed between the second and third insulating layers 12b and 12c. The third in-plane connecting conductor 15 is disposed between the third and fourth insulating layers 12c and 12d.

The first mixture portion 18a is connected to the external electrode 16 and one end of the first in-plane connecting conductor 14a and the second mixture portion 18b is connected to the external electrode 16 and one end of the second in-plane connecting conductor 14b.

The other end of the first in-plane connecting conductor 14a is connected to one end of the first interlayer connecting conductor 13a. The other end of the second in-plane connecting conductor 14b is connected to the other end of the first interlayer connecting conductor 13a and one end of the second interlayer connecting conductor 13b. The other end of the second interlayer connecting conductor 13b is connected to the third in-plane connecting conductor 15.

The first to third in-plane connecting conductors 14a, 14b, and 15, the first and second interlayer connecting conductors 13a and 13b, and the external electrode 16 have conductivity.

The mixture portions 18a and 18b are preferably obtained by dispersing a material including at least one of metal and semiconductor; metal and ceramic; metal, semiconductor, and ceramic; semiconductor and ceramic; semiconductor; metal coated with an inorganic material; metal coated with an inorganic material and semiconductor; metal coated with an inorganic material and ceramic; and metal coated with an inorganic material, semiconductor, and ceramic. The mixture portions 18a and 18b have an overall insulating property.

For example, as schematically shown in FIG. 4, the mixture portions 18a and 18b preferably include a metal material coated with an insulating inorganic material 82, a semiconductor material 84, and a gap 88 dispersed therein. For example, the metal material 80 is preferably made of Cu particles having a diameter of about 2 μm to about 3 μm and the inorganic material 82 is made of $Al_2O_3$ particles having a diameter of about 1 μm or less. The semiconductor material 84 is preferably made of silicon carbide, zinc oxide, or other suitable material, for example.

In the ESD protection device 11 shown in FIG. 2, when a certain voltage or greater is applied between the external electrode 16 and the first and second in-plane connecting conductors 14a and 14b, discharge is generated through the mixture portions 18a and 18b. Since the first and second mixture portions 18a and 18b are connected to each other in parallel between the external electrode 16 and the first and second in-plane connecting conductors 14a and 14b, the responsivity to ESD is improved and, thus, the peak voltage is reduced.

A method for producing the ESD protection device 11 will now be described with reference to FIGS. 3A to 3D. FIGS. 3A to 3D are exploded sectional views of the ceramic multilayer substrate 12.

Ceramic green sheets to be first to fourth insulating layers 12a to 12d of the ceramic multilayer substrate 12 are prepared. A material primarily made of Ba, Al, and Si is preferably used as a ceramic material for the insulating layers 12a to 12d of the ceramic multilayer substrate 12. Raw materials are prepared and mixed so that the mixture has a desired composition, and then the mixture is calcined at about 800° C. to about 1000° C. The calcined powder is pulverized using a zirconia ball mill for about 12 hours to obtain ceramic powder. An organic solvent, such as toluene or EKINEN, for example, is added to the ceramic powder and mixed. A binder and a plasticizer are further added thereto and mixed to obtain slurry. The obtained slurry is formed by a doctor blade method to obtain ceramic green sheets that preferably have a thickness of about 50 μm, for example, for the first to fourth insulating layers 12a to 12d.

An electrode paste for forming first to third in-plane connecting conductors 14a, 14b, and 15 and first and second interlayer connecting conductors 13a and 13b is formed. A solvent is added to about 80 wt % Cu powder having an average particle size of about 1.5 μm, for example, and a binder resin made of ethyl cellulose or other suitable resin, for example, and the mixture is stirred and mixed using a roll to obtain an electrode paste.

A mixture paste for forming first and second mixture portions 18a and 18b is prepared. Cu powder coated with $Al_2O_3$ and having an average particle size of about 2 μm and silicon carbide (SiC) having an average particle size of about 1 μm and functioning as a semiconductor material, for example, are prepared in a certain ratio. A binder resin and a solvent are added thereto and then stirred and mixed using a roll to obtain a mixture paste. The mixture paste preferably includes the binder resin and solvent at a content of about 20 wt % and the Cu powder coated with $Al_2O_3$ and silicon carbide at a content of about 80 wt %, for example.

A paste for forming sealing layers 18p, 18q, 18s, and 18t is prepared by substantially the same method as that of the electrode paste. For example, a solvent is added to about 80 wt % $Al_2O_3$ powder having an average particle size of about 1 μm and a binder resin composed of ethyl cellulose or other suitable resin, and the mixture is stirred and mixed using a roll to obtain a paste (alumina paste) for forming sealing layers. A material having a sintering temperature greater than that of the material of the ceramic multilayer substrate is preferably used as a solid component of the paste for forming sealing layers. Examples of the material include alumina, zirconia, magnesia, mullite, and quartz.

Figure 3A:
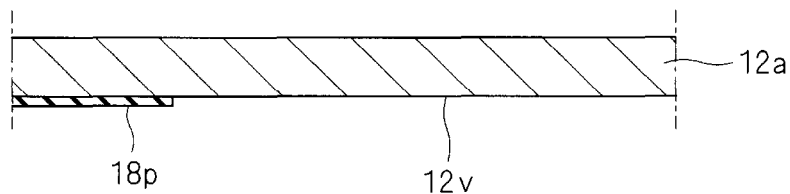
FIGS. 3A to 3D are sectional views showing a production process of the ESD protection device shown in FIG. 2.
Figure 3B:
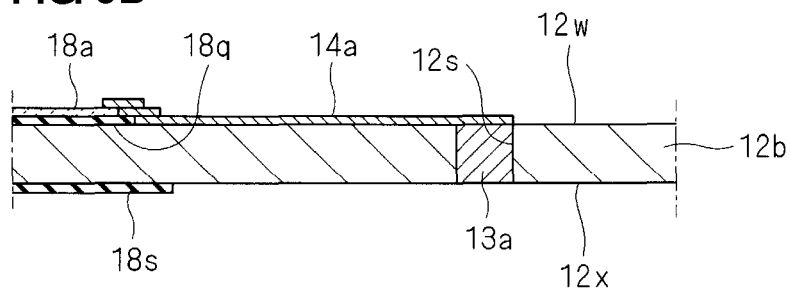
Figure 3C:
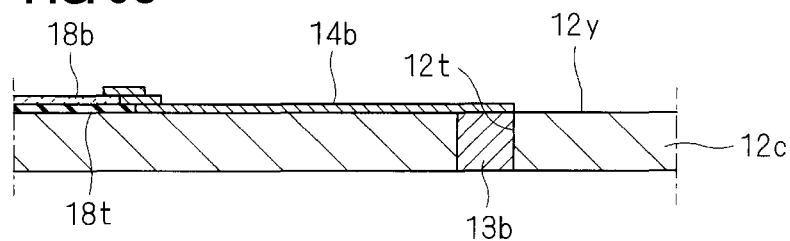

As shown in FIGS. 3B and 3C, via holes 12s and 12t that respectively penetrate between the principal surfaces of ceramic green sheets defining the second and third insulating layers 12b and 12c are formed in the ceramic green sheets using a laser or a mold, for example. Subsequently, the via holes 12s and 12t are filled with the electrode paste by screen printing to form portions defining the first and second interlayer connecting conductors 13a and 13b.

By applying the paste for sealing layers by screen printing and then drying it, as shown in FIGS. 3A and 3B, sealing layers 18p and 18q are respectively formed on the surfaces 12v and 12w that face each other of the ceramic green sheets to be the first and second insulating layers 12a and 12b. Similarly, as shown in FIGS. 3B and 3C, sealing layers 18s and 18t are respectively formed on the surfaces 12x and 12y that face each other of the ceramic green sheets to be the second and third insulating layers 12b and 12c.

As shown in FIGS. 3B and 3C, the mixture paste is then applied by screen printing on the ceramic green sheets to be the second and third insulating layers 12b and 12c to form portions to be first and second mixture portions 18a and 18b.

The portion to be the first mixture portion 18a may be formed on the ceramic green sheet to be the first insulating layer 12a. The portion to be the second mixture portion 18b may be formed on the ceramic green sheet to be the second insulating layer 12b.

Figure 3D:
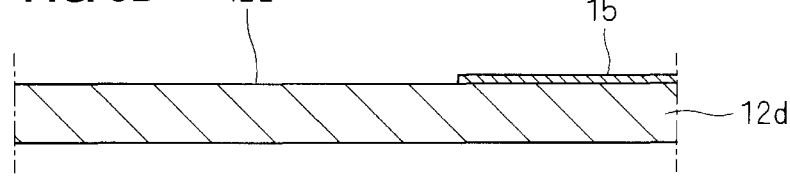

As shown in FIGS. 3B to 3D, the electrode paste is then applied by screen printing on the ceramic green sheets to be the second to fourth insulating layers 12b, 12c, and 12d to form portions to be first to third in-plane connecting conductors 14a, 14b, and 15, respectively. The portions to be the first and second in-plane connecting conductors 14a and 14b are formed so as to overlap the portions to be the mixture portions 18a and 18b, respectively.

The portion to be the first in-plane connecting conductor 14a may be formed on the ceramic green sheet to be the first insulating layer 12a. The portion to be the second in-plane connecting conductor 14b may be formed on the ceramic green sheet to be the second insulating layer 12b. The portion to be the third in-plane connecting conductor 15 may be formed on the ceramic green sheet to be the third insulating layer 12c.

Alternatively, after the portions to be the first to third in-plane connecting conductors 14a, 14b, and 15 are formed on the ceramic green sheets, the portions to be the first and second mixture portions 18a and 18b may be formed.

The ceramic green sheets are laminated and press-bonded with each other in substantially the same manner as in a typical ceramic multilayer substrate.

In the case of a single component or a small-size module component, the laminated body is cut into chips using a micro cutter in substantially the same manner as in a chip-type electronic component, such as an LC filter. In the case of a large-size module component, the four corners are cut. After that, the electrode paste is applied to the end surface to form a portion to be an external electrode 16.

Subsequently, firing is performed preferably in a $N_2$ atmosphere in substantially the same manner as in a typical ceramic multilayer substrate. If the electrode material is not oxidized (e.g., Ag), the firing may be performed in the air. Through the firing, the organic solvent in the ceramic green sheets and the binder resin and solvent in the mixture paste are eliminated. Thus, the first and second mixture portions 18a and 18b including Cu coated with $Al_2O_3$, SiC, and a gap dispersed therein are formed.

Electrolytic Ni—Sn plating is performed on the portion to be the external electrode 16 in substantially the same manner as in a chip-type electronic component, such as an LC filter.

Through the processes described above, the ESD protection device 11 having the configuration shown in FIG. 2 is produced.

The first and second mixture portions 18a and 18b may preferably be formed by the same thick film printing method as that of the in-plane connecting conductors 14a, 14b, and 15. Therefore, the first and second mixture portions 18a and 18b can be easily formed and the thickness thereof can be easily adjusted. Since the first and second mixture portions 18a and 18b can be formed along the principal surface of any insulating layer of the ceramic multilayer substrate, the mixture portions 18a and 18b have a high degree of flexibility in arrangement.

Some or all of the same components as those defining the ceramic multilayer substrate 12 may preferably be included in the material of the first and second mixture portions 18a and 18b. If the same components are included, the shrinkage behavior and/or other characteristics of the first and second mixture portions 18a and 18b during firing can be easily matched with that of the ceramic multilayer substrate 12. As a result, the adhesion of the first and second mixture portions 18a and 18b to the ceramic multilayer substrate 12 is improved, which effectively prevents detachment of the first and second mixture portions 18a and 18b during firing. The resistance to repetitive ESD strikes is also improved. Furthermore, the number of types of materials used is decreased so as to reduce the manufacturing costs.

The metal material included in the first and second mixture portions 18a and 18b may be the same as or different from the metal material included in the first to third in-plane connecting conductors 14a, 14b, and 15. If the same metal material is included, the shrinkage behavior of the first and second mixture portions 18a and 18b can be easily matched with that of the first to third in-plane connecting conductors 14a, 14b, and 15, which decreases the number of types of materials used.

The semiconductor material included in the first and second mixture portions 18a and 18b is not particularly limited to the materials described above. Other examples of the semiconductor material include metal semiconductors such as silicon and germanium; carbides such as silicon carbide, titanium carbide, zirconium carbide, molybdenum carbide, and tungsten carbide; nitrides such as titanium nitride, zirconium nitride, chromium nitride, vanadium nitride, and tantalum nitride; silicides such as titanium silicide, zirconium silicide, tungsten silicide, molybdenum silicide, and chromium silicide; borides such as titanium boride, zirconium boride, chromium boride, lanthanum boride, molybdenum boride, and tungsten boride; and oxides such as zinc oxide and strontium titanate. In particular, silicon carbide and zinc oxide are preferably used because they are commercially available with various particle sizes at relatively low cost. These semiconductor materials may be suitably used alone or in combination of two or more types as a mixture. These semiconductor materials may also be suitably used together with a resistive material, such as alumina or a BAS material, for example, in a mixed manner.

The metal material included in the first and second mixture portions 18a and 18b is not particularly limited to the materials described above. The metal material may preferably be selected from Cu, Ag, Pd, Pt, Al, Ni, W, and Mo; an alloy thereof; and the combination thereof, for example.

Example 3

An ESD protection device 20 of an Example 3 of a preferred embodiment of the present invention will be described with reference to FIGS. 5 to 8B.

Figure 5:
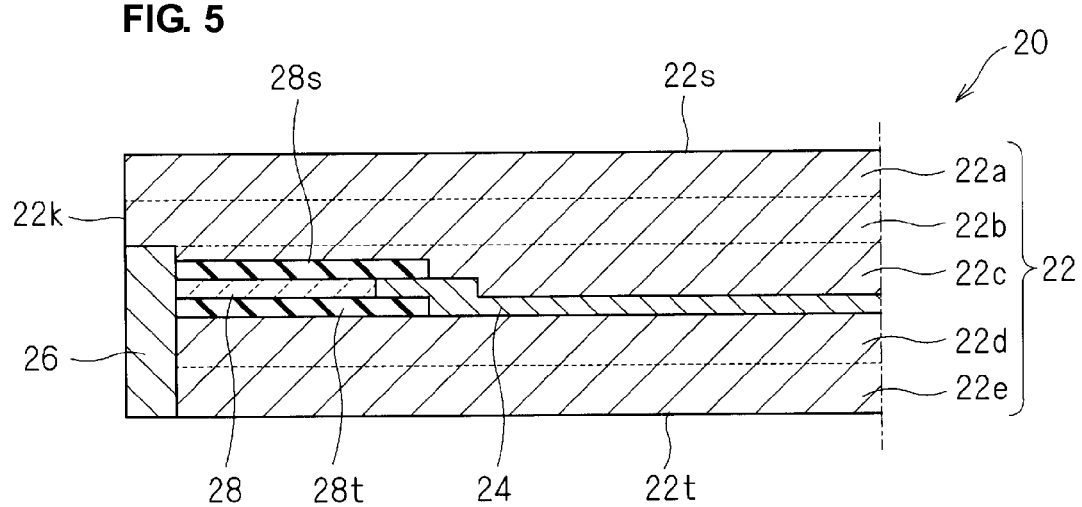
FIG. 5 is a sectional view of a principal portion of an ESD protection device according to another preferred embodiment of the present invention.

FIG. 5 is a sectional view of a principal portion of an ESD protection device 20 of Example 3. The ESD protection device 20 is a single component, e.g., an ESD protection unit, having only an ESD protection function or a composite component having the ESD protection function and other functions.

As shown in FIG. 5, the ESD protection device 20 has substantially the same structure as that of the ESD protection device 10 of Example 1. That is, a ceramic multilayer substrate made by laminating insulating layers 22a to 22e made of a ceramic material preferably includes an in-plane connecting conductor 24, a mixture portion 28, and sealing layers 28s and 28t provided therein. The mixture portion 28 is connected to the in-plane connecting conductor 24 and the external electrode 26.

Unlike the structures of Examples 1 and 2, the external electrode 26 is provided on the side surface of the ceramic multilayer substrate 22 so as to be buried in the ceramic multilayer substrate 22.

As shown in the sectional views of FIGS. 6A to 8B, the ESD protection device 20 can preferably be produced by substantially the same method as those of Examples 1 and 2.

First, as shown in FIG. 7, a portion 24a to be an in-plane connecting conductor 24, portions 28u and 28v to be sealing layers 28s and 28t, and portions 26a, 26b, and 26c to be an external electrode 26 are formed on the ceramic green sheets to be insulating layers 22a to 22e.

Figure 6A:
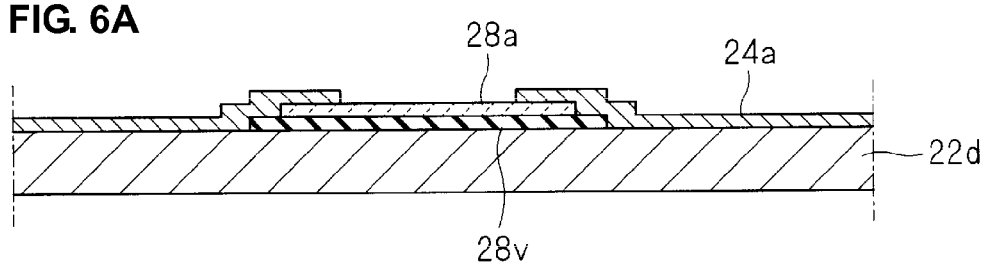
FIGS. 6A to 6C are sectional views showing a production process of the ESD protection device shown in FIG. 5.
Figure 6B:
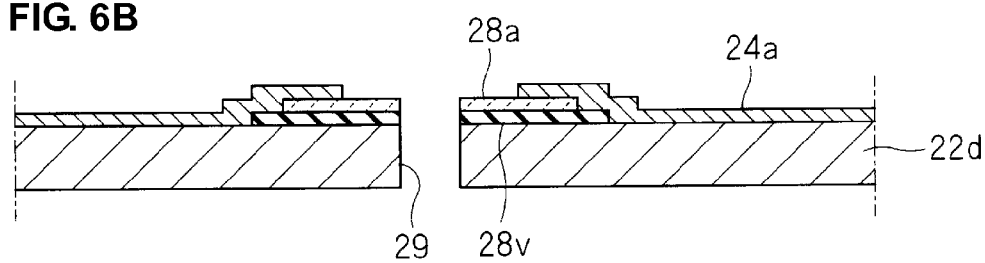
Figure 6C:
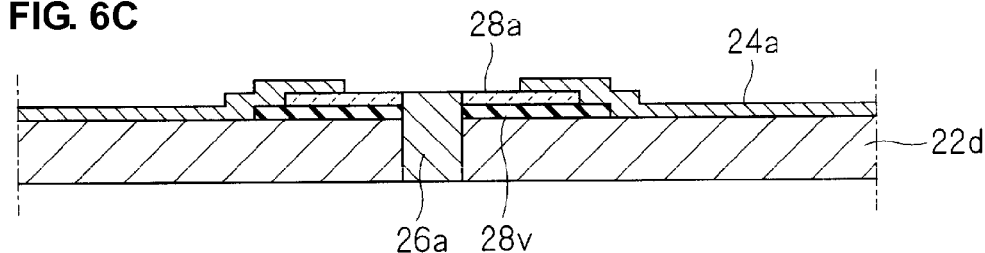

Herein, the portion 26a to be the external electrode 26 is preferably formed as follows. As shown in FIG. 6A, the portion 28v to be the sealing layer 28t, the portion 28a to be the mixture portion 28, and the portion 24a to be the in-plane connecting conductor 24 are formed by sequentially printing the corresponding pastes on the ceramic green sheet to be the insulating layer 22d. As shown in FIG. 6B, a via hole 29 is then formed. Subsequently, as shown in FIG. 6C, the via hole 29 is filled with the electrode paste by printing to form the portion 26a to be the external electrode 26.

In the ceramic green sheet to be the insulating layer 22c, the portion 28u to be the sealing layer 28s is formed, a via hole is formed, and then the via hole is filled with the electrode paste by printing. Thus, the portion 26b to be the external electrode 26 is formed.

In the ceramic green sheet to be the insulating layer 22e, a via hole is formed and then the via hole is filled with the electrode paste by printing. Thus, the portion 26c to be the external electrode 26 is formed.

Figure 8A:
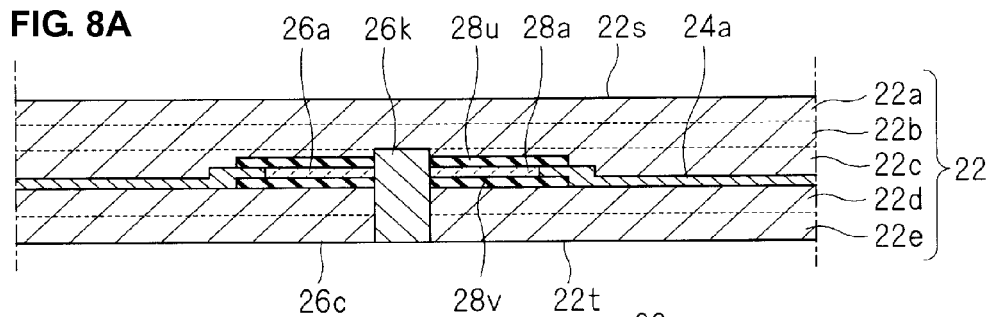
FIGS. 8A and 8B are sectional views showing a production process of the ESD protection device shown in FIG. 5.

Next, as shown in FIG. 8A, the ceramic green sheets to be the insulating layers 22a to 22e are laminated and press-bonded with each other to form a laminated body.

Figure 8B:
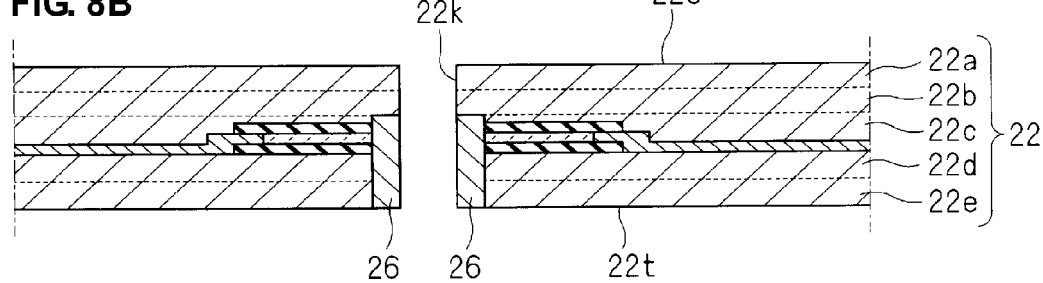
Figure 9:
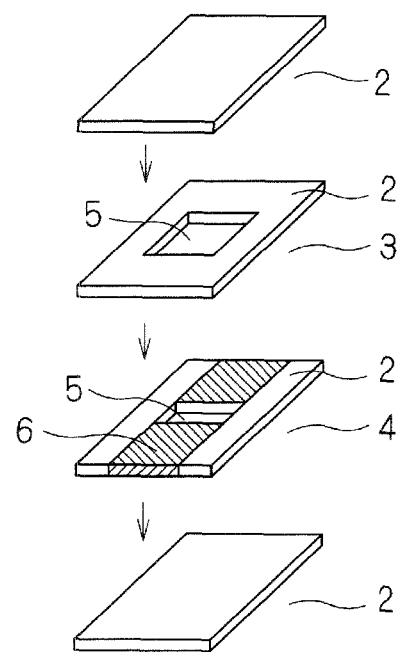
FIG. 9 is an exploded perspective view of a known ESD protection device.
Figure 10:
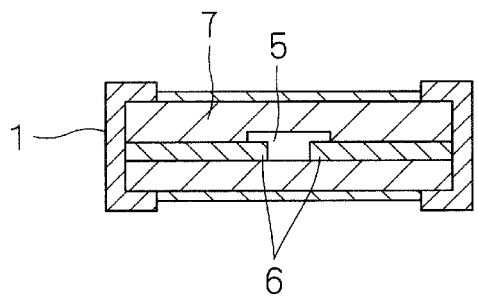
FIG. 10 is a sectional view of the ESD protection device shown in FIG. 9.

As shown in FIG. 8B, the laminated body is cut along a plane that vertically passes through a portion 26k to be the external electrode 26.

The chip is fired and plating is performed on the external electrode.

As in the ESD protection devices of Examples 1 and 2, the size of the ESD protection device 20 can be easily reduced and have high reliability in terms of an ESD protection function.

As described above, when the external electrode is connected to the mixture portion and the external electrode is used as one of the discharge electrodes, the size of ESD protection device can be reduced and the reliability of an ESD protection function is improved.

Preferred embodiments of the present invention are not limited to the above-described preferred embodiments, and various modifications can be made.

For example, a mixture portion and an in-plane connecting conductor connected to the mixture portion may be provided on the surface of a ceramic multilayer substrate. In this case, the mixture portion and the connecting conductor exposed on the surface of the ceramic multilayer substrate are preferably covered with a cover layer having an insulating property or covered with a member having a lid shape so as to provide a space.

In the case in which an in-plane connecting conductor connected to a mixture portion is provided inside a ceramic multilayer substrate, the following structure may be used. That is, a cavity that is in contact with the mixture portion is provided in the ceramic multilayer substrate, and a portion of an external electrode connected to the mixture portion and a portion of the in-plane connecting conductor or an interlayer connecting conductor connected to the mixture portion are exposed in the cavity. By providing the cavity, gaseous discharge can be generated in the cavity and, thus, the ESD characteristics can be further improved. The cavity can preferably be formed, for example, by the method below. A resin paste to be eliminated, e.g., acrylic paste or carbon paste, is applied in a region that is in contact with the region in which the pastes for forming the mixture portion, the external electrode, and the in-plane connecting conductor or interlayer connecting conductor form portions to be exposed in the cavity. The resin paste is then eliminated through firing and, thus, the cavity is formed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
   a ceramic multilayer substrate including a plurality of laminated insulating layers made of a ceramic material;
   at least one external electrode provided on a side surface of the ceramic multilayer substrate so as to be exposed outside of the ceramic multilayer substrate;
   at least one of an in-plane connecting conductor provided along a first principal surface of one of the plurality of insulating layers and an interlayer connecting conductor arranged so as to penetrate between the first principal surface and a second principal surface of the one of the plurality of insulating layers, the in-plane connecting conductor and the interlayer connecting conductor having conductivity; and
   a mixture portion provided along the first principal surface of the insulating layer and including a dispersed material including at least one of metal and semiconductor; metal and ceramic; metal, semiconductor, and ceramic; semiconductor and ceramic; semiconductor; metal coated with an inorganic material; metal coated with an inorganic material and semiconductor; metal coated with an inorganic material and ceramic; and metal coated with an inorganic material, semiconductor, and ceramic; wherein
   the mixture portion is connected to the at least one external electrode and the at least one of the in-plane connecting conductor and the interlayer connecting conductor.

2. The ESD protection device according to claim 1, wherein the mixture portion includes a metal material and a semiconductor material dispersed therein.

3. The ESD protection device according to claim 2, wherein the semiconductor material dispersed in the mixture portion is silicon carbide or zinc oxide.

4. The ESD protection device according to claim 1, wherein metal particles coated with an insulating inorganic material are dispersed in the mixture portion.

5. The ESD protection device according to claim 1, further comprising a sealing layer extending between the insulating layer and the mixture portion.

* * * * *